United States Patent
Chu et al.

(10) Patent No.: US 11,948,987 B2
(45) Date of Patent: Apr. 2, 2024

(54) SELF-ALIGNED BACKSIDE SOURCE CONTACT STRUCTURE

(71) Applicant: Taiwan Semiconductor Manufacturing Co., Ltd., Hsinchu (TW)

(72) Inventors: Lung-Kun Chu, New Taipei (TW); Mao-Lin Huang, Hsinchu (TW); Chung-Wei Hsu, Hsinchu (TW); Jia-Ni Yu, Hsinchu (TW); Kuo-Cheng Chiang, Hsinchu County (TW); Kuan-Lun Cheng, Hsin-Chu (TW); Chih-Hao Wang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 112 days.

(21) Appl. No.: 17/016,109

(22) Filed: Sep. 9, 2020

(65) Prior Publication Data
US 2021/0376093 A1 Dec. 2, 2021

Related U.S. Application Data

(60) Provisional application No. 63/031,269, filed on May 28, 2020.

(51) Int. Cl.
*H01L 29/417* (2006.01)
*H01L 21/02* (2006.01)
(Continued)

(52) U.S. Cl.
CPC .. *H01L 29/41733* (2013.01); *H01L 21/02532* (2013.01); *H01L 21/02576* (2013.01);
(Continued)

(58) Field of Classification Search
CPC ........... H01L 23/528; H01L 21/823475; H01L 21/743; H01L 23/481; H01L 21/76895; H01L 29/7851
See application file for complete search history.

(56) References Cited

U.S. PATENT DOCUMENTS 9,818,872 B2 11/2017 Ching et al.
9,887,269 B2 2/2018 Ching et al.
(Continued)

FOREIGN PATENT DOCUMENTS

| JP | 2010171166 A | 8/2010 |
|---|---|---|
| KR | 20190015269 | 2/2019 |
| WO | 2018004653 A1 | 1/2018 |

*Primary Examiner* — Brian Turner
(74) *Attorney, Agent, or Firm* — HAYNES AND BOONE, LLP

(57) ABSTRACT

A semiconductor device according to the present disclosure includes a source feature and a drain feature, a plurality of semiconductor nanostructures extending between the source feature and the drain feature, a gate structure wrapping around each of the plurality of semiconductor nanostructures, a bottom dielectric layer over the gate structure and the drain feature, a backside power rail disposed over the bottom dielectric layer, and a backside source contact disposed between the source feature and the backside power rail. The backside source contact extends through the bottom dielectric layer.

20 Claims, 17 Drawing Sheets

(51) Int. Cl.
*H01L 21/306* (2006.01)
*H01L 21/311* (2006.01)
*H01L 21/768* (2006.01)
*H01L 23/528* (2006.01)
*H01L 29/06* (2006.01)
*H01L 29/423* (2006.01)
*H01L 29/45* (2006.01)
*H01L 29/66* (2006.01)
*H01L 29/786* (2006.01)

(52) U.S. Cl.
CPC .. *H01L 21/02579* (2013.01); *H01L 21/02603* (2013.01); *H01L 21/30604* (2013.01); *H01L 21/31111* (2013.01); *H01L 21/76897* (2013.01); *H01L 23/5286* (2013.01); *H01L 29/0673* (2013.01); *H01L 29/42392* (2013.01); *H01L 29/45* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,199,502 | B2 | 2/2019 | Huang et al. |
| 10,290,546 | B2 | 5/2019 | Chiang et al. |
| 10,475,902 | B2 | 11/2019 | Lee et al. |
| 2018/0175036 | A1 | 6/2018 | Ching et al. |
| 2018/0323312 | A1 | 11/2018 | Van Dal et al. |
| 2019/0122920 | A1* | 4/2019 | Su ............. H01L 23/5226 |
| 2019/0164882 | A1 | 5/2019 | Chen et al. |
| 2019/0172828 | A1 | 6/2019 | Smith et al. |
| 2019/0348367 | A1 | 11/2019 | Fu et al. |
| 2020/0051981 | A1* | 2/2020 | Yang ............. H01L 29/7851 |
| 2020/0075771 | A1 | 3/2020 | Kobrinsky et al. |
| 2020/0135646 | A1* | 4/2020 | Rubin ............. H01L 23/535 |
| 2020/0135853 | A1* | 4/2020 | Bao ............. H01L 29/0653 |
| 2020/0266060 | A1* | 8/2020 | Cheng ............. H01L 29/0673 |
| 2020/0294998 | A1* | 9/2020 | Lilak ............. H01L 23/53295 |
| 2020/0350322 | A1* | 11/2020 | Liu ............. G11C 11/5621 |
| 2020/0357930 | A1* | 11/2020 | Glass ............. H01L 29/42392 |
| 2021/0098294 | A1* | 4/2021 | Smith ............. H01L 21/76802 |
| 2021/0098306 | A1* | 4/2021 | Smith ............. H01L 27/088 |
| 2021/0202319 | A1* | 7/2021 | Agrawal ............. H01L 27/092 |
| 2021/0210601 | A1* | 7/2021 | Pidin ............. H01L 29/0847 |
| 2021/0280474 | A1* | 9/2021 | Wang ............. H01L 21/823431 |

\* cited by examiner

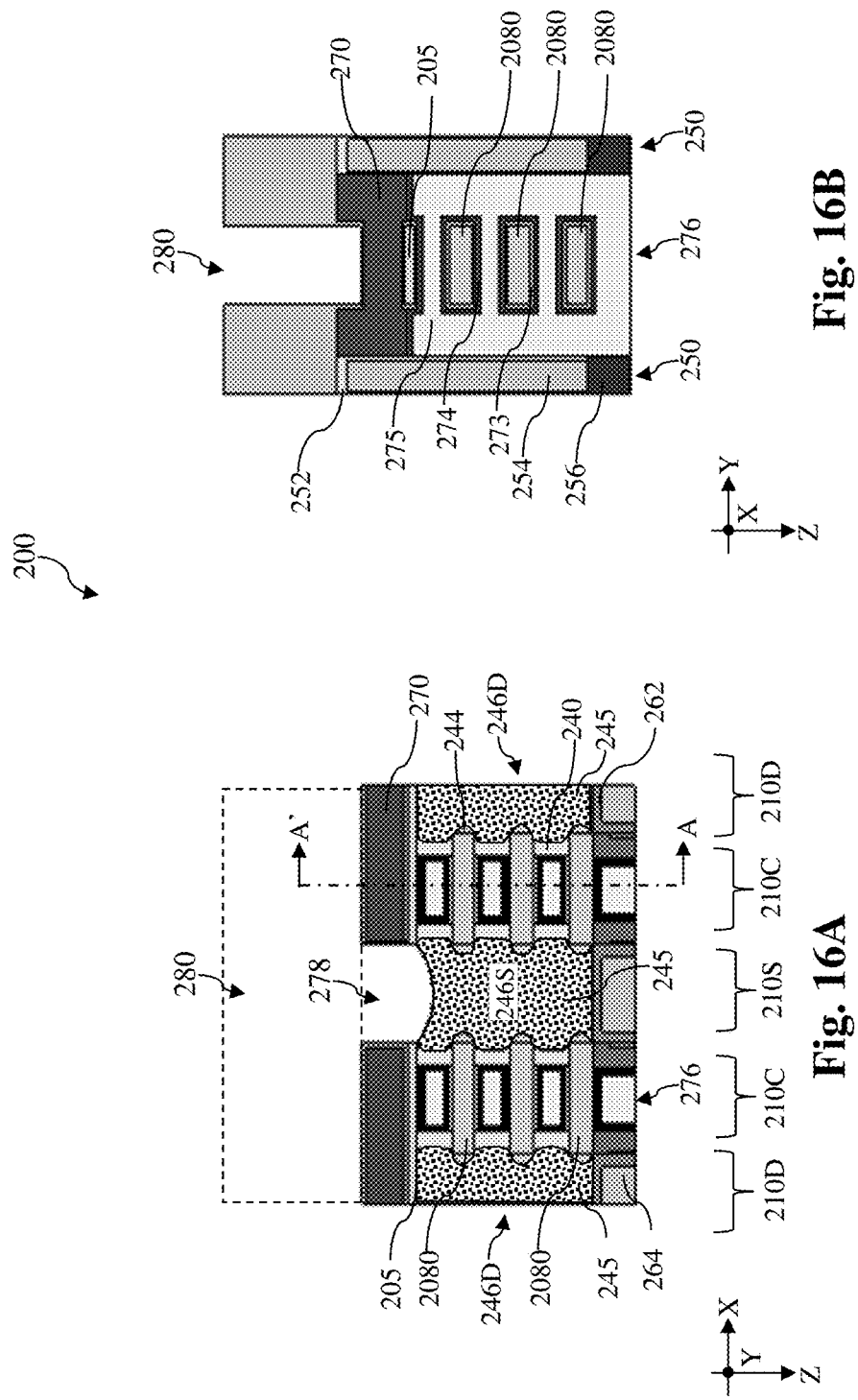

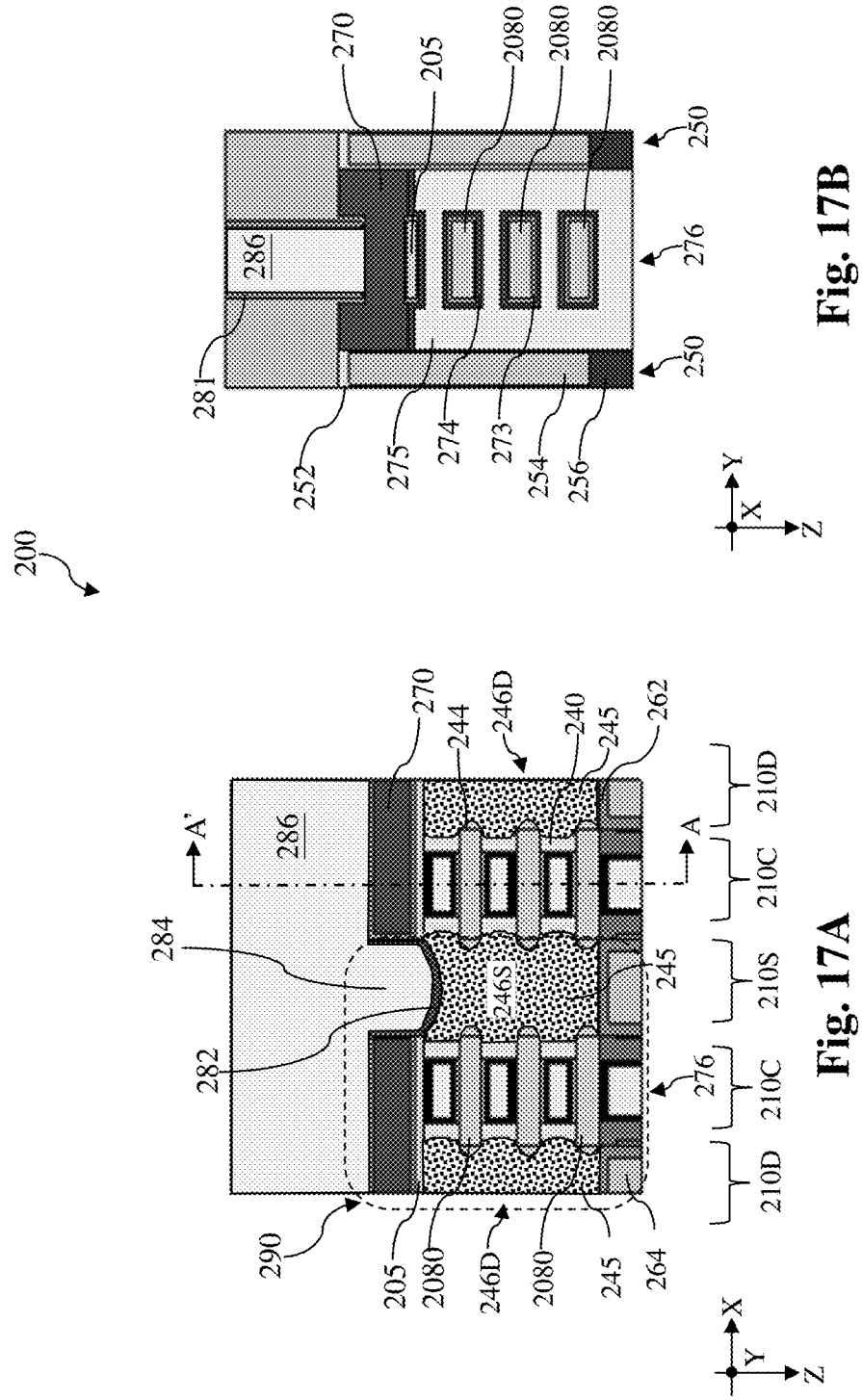

SELF-ALIGNED BACKSIDE SOURCE CONTACT STRUCTURE

PRIORITY DATA

This application claims priority to U.S. Provisional Patent Application No. 63/031,269 filed on May 28, 2020, entitled "SELF-ALIGNED BACKSIDE SOURCE CONTACT STRUCTURE", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the spacings between gate structures and source/drain features in multi-gate devices shrink, some electrical routing is moved to the backside. However, when forming backside contact openings, overlay variations may result in device defects. Therefore, while existing backside contact structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-9, 10A-17A and 10B-17B illustrate fragmentary cross-sectional views of a workpiece during a fabrication process according to the method of FIG. 1, according to one or more aspects of the present disclosure.

DETAILED DESCRIPTION

Figure 1:
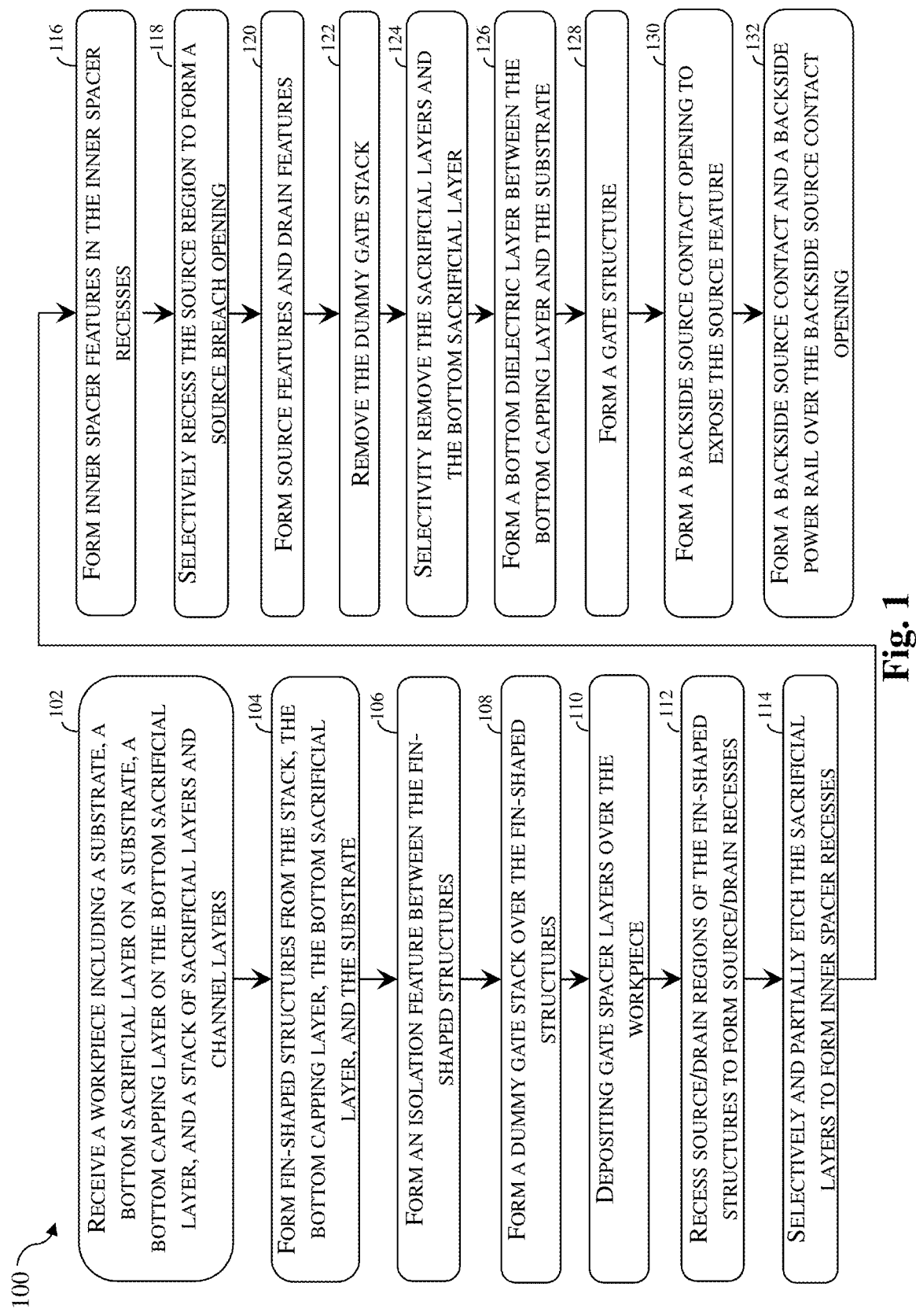
FIG. 1 illustrates a flow chart of a method for forming a semiconductor device having a bottom dielectric layer, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to backside contact structures for multi-gate transistors, and more particularly to self-aligned backside contact structures.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. These multi-gate devices may be either n-type or p-type. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, bridge-shaped channel members, and/or other suitable channel configurations. Backside contact structures, such as backside power rails (BPRs), may be beneficial for MBC transistors because they provide additional first metal line (M0), allow higher gate densities, and widens power rails for low resistance. However, due to overlay variations, it can be challenging to form satisfactory BPRs without causing short circuits, such as a short circuit between a backside source contact and a gate structure.

The present disclosure provides embodiments of a semiconductor device that includes a bottom self-aligned contact (SAC) dielectric layer that covers the backsides of the source feature and the gate structure to allow selective access to the source feature. As a result, formation of a backside source contact opening to the source feature is self-aligned and does not require high overlay precision.

The various aspects of the present disclosure will now be described in more detail with reference to the figures. FIG. 1 illustrates a flowchart illustrating method 100 for forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with fragmentary cross-sectional views of the workpiece at different stages of fabrication according to embodiments of method 100. For avoidance of doubts, throughout the figures, the X direction is perpendicular to the Y direction and the Z direction is perpendicular to both the X direction and the Y direction.

Figure 2:
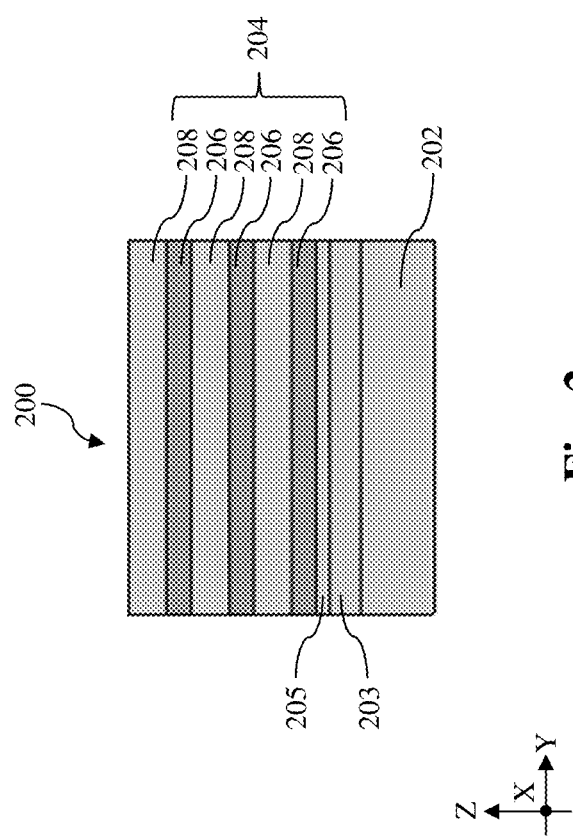

Referring to FIGS. 1 and 2, method 100 includes a block 102 where a workpiece 200 is provided. The workpiece 200 includes a substrate 202, a bottom sacrificial layer 203 disposed over the substrate 202, a bottom capping layer 205 disposed over the bottom sacrificial layer 203, and a stack 204 disposed over the bottom capping layer 205. The stack 204 includes a plurality of channel layers 208 and a plurality of sacrificial layers 206. Because the workpiece 200 will be fabricated into a semiconductor device, the workpiece 200 may be referred to as a semiconductor device 200 as the context requires. In some embodiments, the substrate 202 may be a semiconductor substrate such as a silicon substrate. The substrate 202 may also include other semiconductors such as germanium, silicon carbide (SiC), silicon germanium (SiGe), or diamond. Alternatively, the substrate 202 may include a compound semiconductor and/or an alloy semiconductor. In the depicted embodiment, the substrate 202 is a silicon substrate.

In some embodiments, the bottom sacrificial layer 203 may include a semiconductor material, such as silicon germanium (SiGe). In those embodiments, the bottom sacrificial layer 203 may include a first germanium content between about 10% and about 50%. In some implementations, the bottom sacrificial layer 203 is epitaxially deposited on the substrate 202 using a molecular beam epitaxy (MBE) process, vapor-phase epitaxy (VPE), ultra-high vacuum CVD (UHV-CVD)), a metalorganic chemical vapor deposition (MOCVD) process, and/or other suitable epitaxial growth processes. In some instances, the bottom sacrificial layer 203 is formed to a thickness between about 8 nm and about 15 nm.

The bottom capping layer 205 includes a semiconductor material different from that forming the bottom sacrificial layer 203. In some embodiments, the bottom capping layer 205 is formed of silicon (Si). In some implementations, the bottom capping layer 205 is epitaxially deposited on the bottom sacrificial layer 203 using an MBE process, a VPE process, an UHV-CVD process, an MOCVD process, and/or other suitable epitaxial growth processes. As will be described below, the bottom capping layer 205 functions to control the recessing of the bottom sacrificial layer 203 and is not intended to become a channel member. For these reasons, the bottom capping layer 205 may have a thickness smaller than that of each of the channel layers 208. In some instances, the bottom capping layer 205 has a thickness between about 2 nm and about 5 nm.

As illustrated in FIG. 2, the sacrificial layers 206 and the channel layers 208 in the stack 204 are stacked alternatingly such that the sacrificial layers 206 are interleaved by the channel layers 208 and vice versa. The sacrificial layers 206 and the channel layers 208 are formed of different semiconductor materials configured to allow selective removal of sacrificial layers 206 without substantially damaging the channel layers 208. In an embodiment, the sacrificial layers 206 include silicon germanium (SiGe) and the channel layers 208 include silicon (Si). In this embodiment, the sacrificial layers 206 include a second germanium content that may be greater than the first germanium content of the bottom sacrificial layer 203. In some instances, the second germanium concentration is between about 10% and about 50%. Because a greater germanium content in silicon germanium (SiGe) results in a faster etching rate, the greater second germanium content of the sacrificial layers 206 (as compared to the first germanium content) allows selective recessing of the sacrificial layers 206 during the formation of the inner spacer recesses (to be described below). Additionally, the different germanium contents may be configured to achieve simultaneous removal of the sacrificial layers 206 and the bottom sacrificial layer 203 in a subsequent process. By way of example, the sacrificial layers 206 and the channel layers 208 in the stack 204 may be formed by an MBE process, a VPE process, an UHV-CVD process, an MOCVD process, and/or other suitable epitaxial growth processes.

It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of sacrificial layers and channel layers may be formed in the stack 204. The number of layers depends on the desired number of channels members for the semiconductor device 200. In some embodiments, the number of channel layers 208 is between 2 and 10. In some embodiments, all sacrificial layers 206 may have a substantially uniform first thickness and all of the channel layers 208 may have a substantially uniform second thickness. The first thickness and the second thickness may be identical or different. The channel layers 208 or parts thereof may serve as channel member(s) for a subsequently-formed multi-gate device and the thickness of each of the channel layers 208 is chosen based on device performance considerations. The sacrificial layers 206 may eventually be removed and serve to define a vertical distance between adjacent channel region(s) for a subsequently-formed multi-gate device and the thickness of each of the sacrificial layers 206 is chosen based on device performance considerations. In some embodiments, the first thickness of the sacrificial layer 206 is smaller than the thickness of the bottom sacrificial layer 203. In some instances, the first thickness of the sacrificial layer 206 may be between about 6 nm and about 13 nm. In these embodiments, the thicker bottom sacrificial layer 203 will lead to a bottom dielectric layer that is thicker than the vertical distance between channel members.

Figure 3:
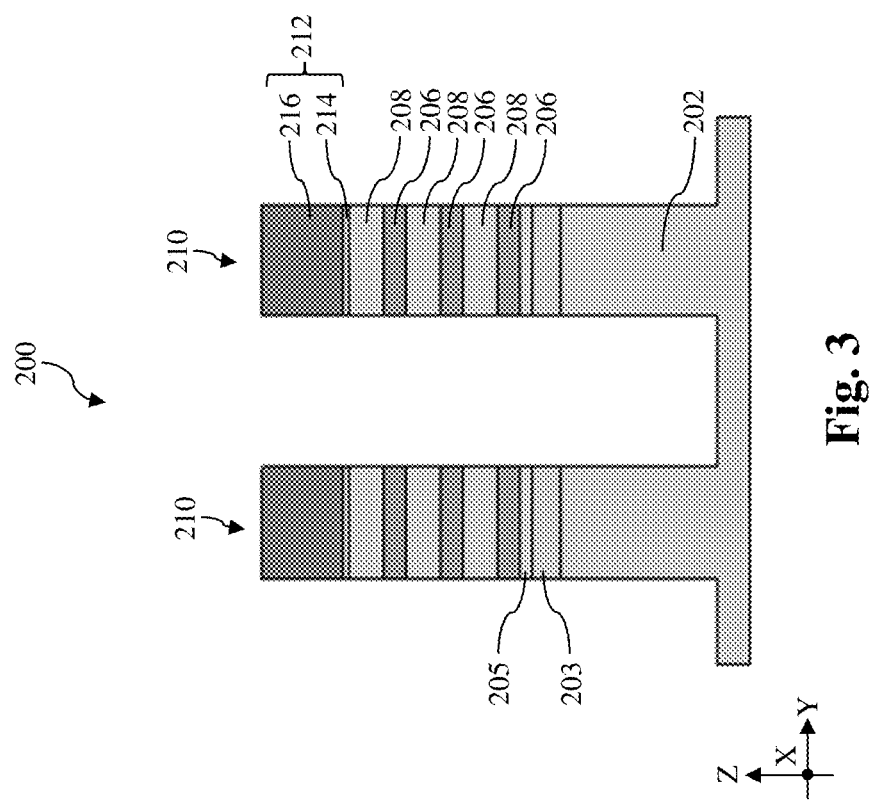

Referring to FIGS. 1 and 3, method 100 includes a block 104 where fin-shaped structures 210 are formed from the stack 204, the bottom capping layer 205, the bottom sacrificial layer 203, and the substrate 202. At block 108, the stack 204, the bottom capping layer 205, the bottom sacrificial layer 203, and a portion of the substrate 202 are patterned using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. As shown in FIG. 3, a fin-top hard mask 212 may be formed over the stack 204 to facilitate the photolithography process. The fin-top hard mask 212 may be a single layer or a multi-layer. In the embodiments represented in FIG. 3, the fin-top hard mask 212 is a multi-layer and includes an oxide layer 214 and a nitride layer 216 over the oxide layer. The oxide layer 214 may include silicon oxide or silicon oxycarbide and the nitride layer 216 includes silicon nitride or silicon carbonitride. The etch process may include dry etching (e.g., reactive ion etching (RIE)), wet etching, and/or other etching methods. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The patterned material layer is then removed, and the remaining spacers, or mandrels, may then be used to pattern the fin-shaped structures 210 by etching the stack 204, the bottom capping layer 205, the bottom sacrificial layer 203, and a portion of the substrate 202.

Figure 4:
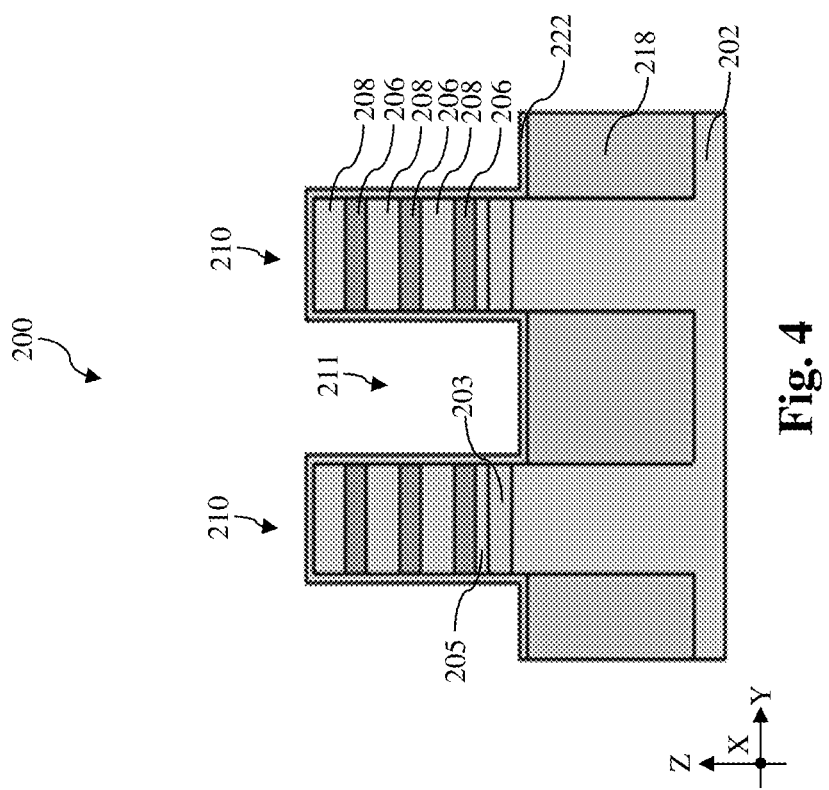

Referring to FIGS. 1 and 4, method 100 includes a block 106 where an isolation feature 218 between the fin-shaped structures 210. In some embodiments, the isolation feature 218 may be deposited in trenches 211 between neighboring fin-shaped structures 210 to isolate them from one another. The isolation feature 218 may also be referred to as a shallow trench isolation (STI) feature 218. By way of example, in some embodiments, a dielectric material for the isolation feature 218 is first deposited over the substrate 202, filling the trenches 211 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric layer may be deposited by a spin-on coating process, a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI features 218. As shown in FIG. 4, at least a portion of the fin-shaped structures 210 that is formed from the stack 204 rises above the STI features 218 after the recessing.

Figure 5:
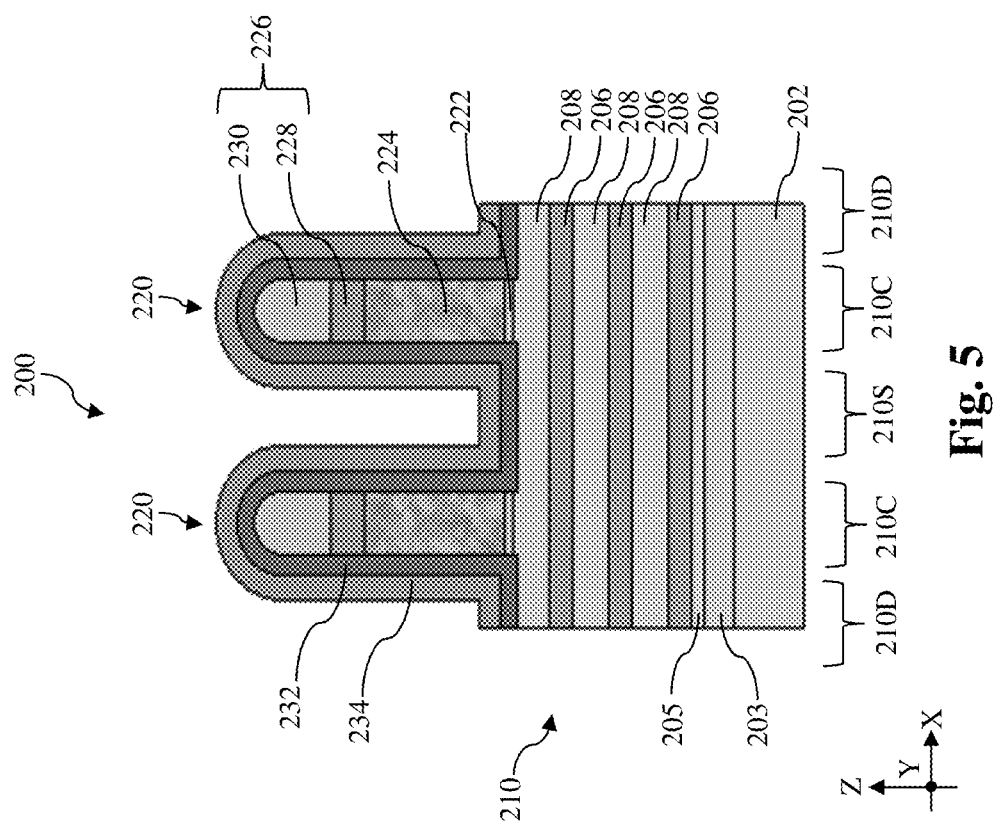

Referring to FIGS. 1, 4 and 5, method 100 includes a block 108 where a dummy gate stack 220 is formed over a channel region 210C of the fin-shaped structures 210. In some embodiments represented in FIG. 5, the dummy gate stack 220 includes a dummy dielectric layer 222 and a dummy electrode layer 224. In those embodiments, a gate-top hard mask layer 226 that is used to pattern the dummy gate stack 220 may remain on top of the dummy electrode layer 224 to protect the dummy electrode layer 224. In the depicted embodiments, the gate-top hard mask layer 226 may be include a nitride hard mask layer 228 and an oxide hard mask layer 230 over the nitride hard mask layer 228. In some implementations, the dummy dielectric layer 222 may include silicon oxide, the dummy electrode layer 224 may include polysilicon, the nitride hard mask layer 228 may include silicon nitride or silicon oxynitride, and the oxide hard mask layer 230 may include silicon oxide. In an example process for forming the dummy gate stack 220, a dummy dielectric layer 222 is first deposited over the fin-shaped structure 210 by CVD, ALD, chemical oxidation, or thermal oxidation, as shown in FIG. 4. The dummy electrode layer 224 and the gate-top hard mask layer 226 are then deposited over the dummy dielectric layer 222 using a CVD process, an ALD process, or a suitable deposition process. The gate-top hard mask layer 226, the dummy electrode layer 224 and the dummy dielectric layer 222 are then patterned using photolithography and etch processes to form the dummy gate stack 220, as illustrated in FIG. 5. Like the formation of the fin-shaped structures 210, double-patterning or multiple-patterning processes may be used to pattern the dummy gate stack 220.

The dummy gate stack 220 serves as a placeholder to undergo various processes and is to be removed and replaced by the functional gate structure at a later step. As shown in FIG. 5, the dummy gate stacks 220 are disposed over the channel regions 210C of the fin-shaped structures 210. Each of the channel regions 210C is disposed between a source region 210S and a drain region 210D along the lengthwise direction of the fin-shaped structure 210, which is aligned with the X direction.

Referring to FIGS. 1 and 5, method 100 includes a block 110 where a first gate spacer layer 232 and a second gate spacer layer 234 are deposited over the workpiece 200. The first gate spacer layer 232 and the second gate spacer layer 234 are deposited conformally over the workpiece 200, including over top surfaces and sidewalls of the dummy gate stack 220 and top surfaces of the fin-shaped structure 210. The term "conformally" may be used herein for ease of description of a layer having substantially uniform thickness over various regions. The first gate spacer layer 232 and the second gate spacer layer 234 may have different dielectric constants as well as different etch selectivity. In some implementations, a dielectric constant of the first gate spacer layer 232 is smaller than a dielectric constant of the second gate spacer layer 234 and the second gate spacer layer 234 is more etch resistant that the first gate spacer layer 232. In some embodiments, the first gate spacer layer 232 may include silicon oxide, silicon oxycarbide, or a suitable low-k dielectric material. The second gate spacer layer 234 may include silicon carbonitride, silicon nitride, zirconium oxide, aluminum oxide, or a suitable dielectric material. The first gate spacer layer 232 and the second gate spacer layer 234 may be deposited over the dummy gate stack 220 using processes such as, a CVD process, a subatmospheric CVD (SACVD) process, a flowable CVD process, an ALD process, a PVD process, or other suitable process.

Figure 6:
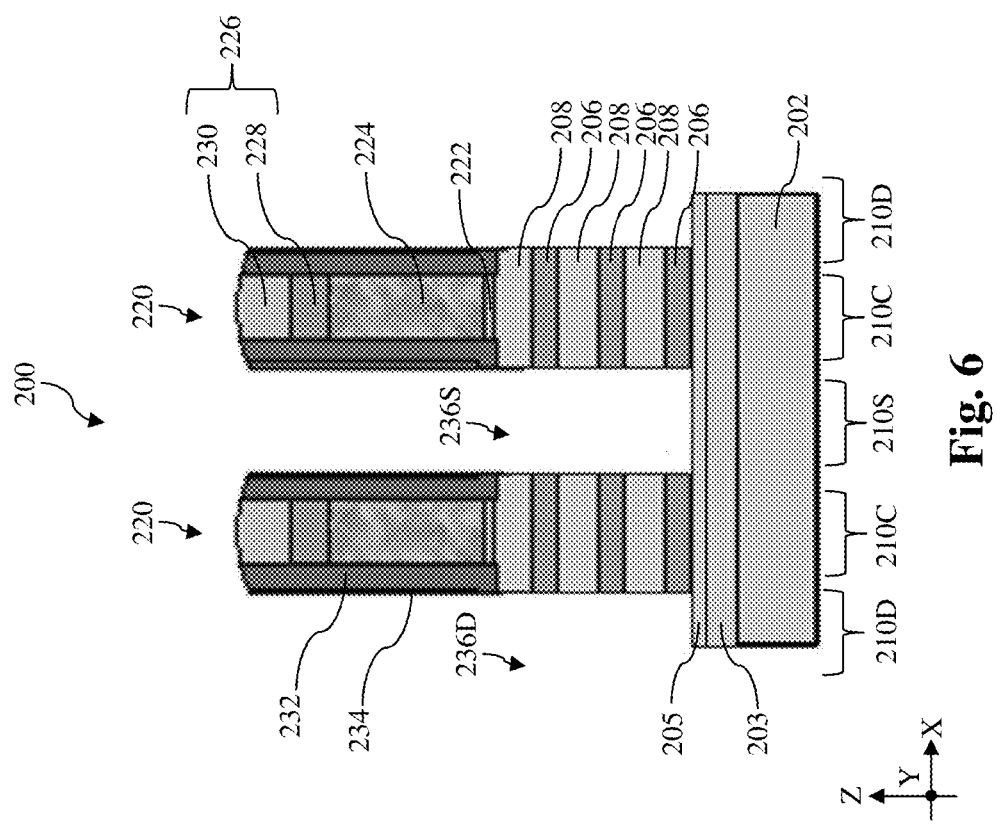

Referring to FIGS. 1 and 6, method 100 includes a block 112 where the source regions 210S and drain regions 210D of the fin-shaped structures 210 are recessed. In some embodiments, the source regions 210S and drain regions 210D of the fin-shaped structures 210 that are not covered by the dummy gate stack 220, the first gate spacer layer 232 and the second gate spacer layer 234 are anisotropically etched by a dry etch or a suitable etching process to form source recesses 236S and drain recesses 236D. For example, the dry etch process may implement an oxygen-containing gas, a fluorine-containing gas (e.g., $CF_4$, $SF_6$, $CH_2F_2$, $CHF_3$, $C_4F_8$, $C_4F_6$, $CH_3F$, and/or $C_2F_6$), a carbon-containing gas (e.g., CO and/or $CH_4$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 6, sidewalls of the sacrificial layers 206 and the channel layers 208 in the channel region 210C are exposed in the source recess 236S and the drain recess 236D. The recess at block 112 is controlled to terminate on or around a top surface of the bottom capping layer 205. In this regard, the bottom capping layer 205 serves as an etch stop layer (ESL) as it etches at a smaller rate than the sacrificial layer 206 directly on the bottom capping layer 205.

Figure 7:
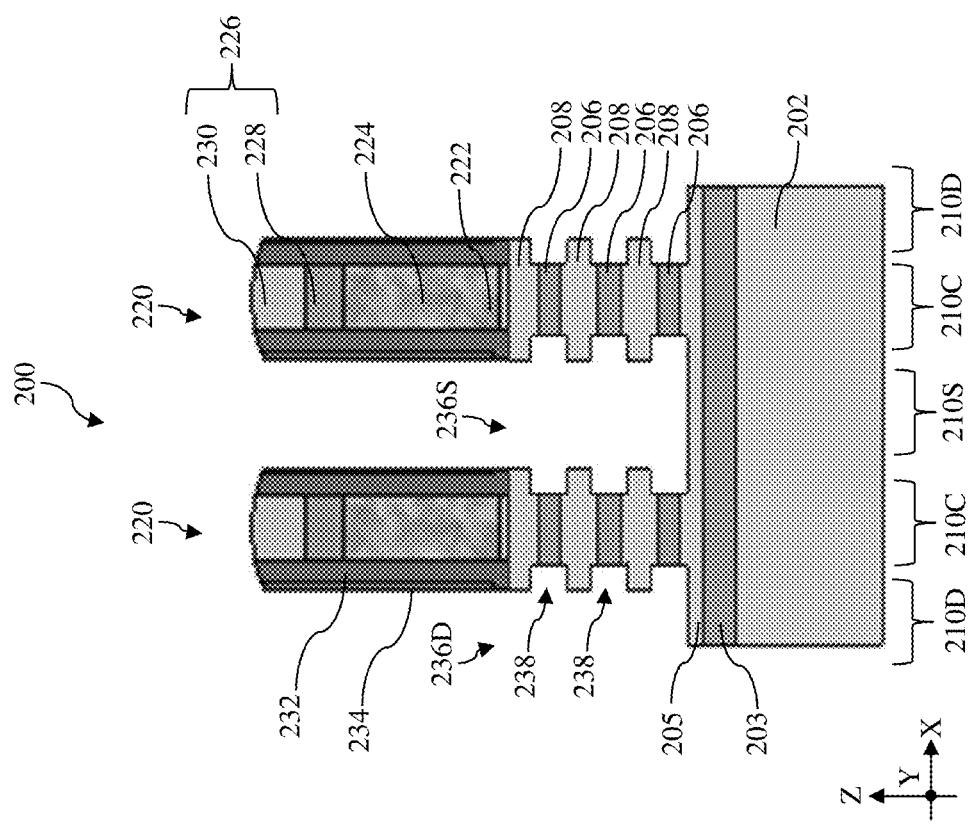

Referring to FIGS. 1 and 7, method 100 includes a block 114 where the sacrificial layers 206 in the channel region 210C are selectively and partially etched to form inner spacer recesses 238. At block 114, the sacrificial layers 206 exposed in the source recesses 236S and drain recesses 236D are selectively and partially recessed along the X direction to form inner spacer recesses 238 while the second gate spacer layer 234, the first gate spacer layer 232, the gate-top hard mask layer 226, the channel layers 208, and the bottom capping layer 205 are substantially unetched. In embodiments where both the bottom sacrificial layer 203 and the sacrificial layers 206 are both formed of silicon germanium, the bottom sacrificial layer 203 may also be recessed, albeit more moderately due to its smaller germanium content. As described above, the lower first germanium content in the bottom sacrificial layer 203 allows it to be etched more slowly than the sacrificial layers 206 that has a higher second germanium content. In embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some alternative embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant.

Figure 8:
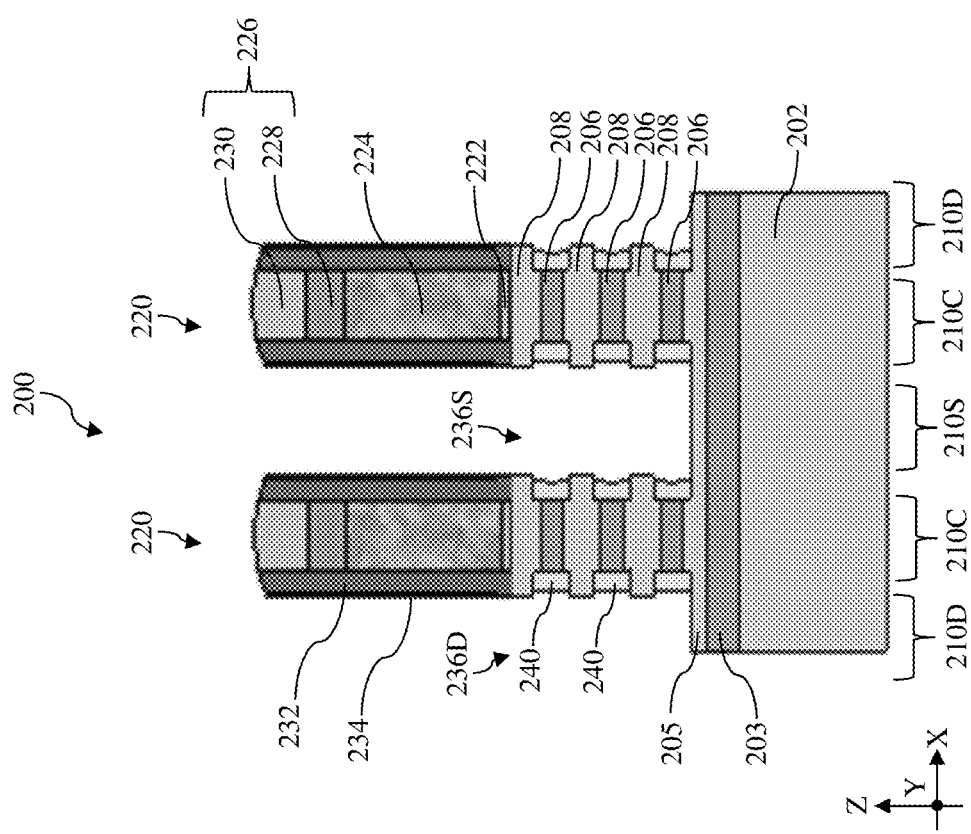

Referring to FIGS. 1 and 8, method 100 includes a block 116 where inner spacer features 240 are formed in the inner spacer recesses 238. In some embodiments, operations at block 116 may include blanket deposition of an inner spacer material layer over the workpiece 200 and an etch-back of the inner spacer material layer to form the inner spacer features 240. The inner spacer material layer may be a single layer or a multilayer. In some implementations, the inner spacer material layer may be deposited using CVD, PECVD, LPCVD, ALD or other suitable method. The inner spacer material layer may include metal oxides, silicon oxide, silicon oxycarbonitride, silicon nitride, silicon oxynitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide.

The deposited inner spacer material layer is then etched back to remove the inner spacer material layer from the sidewalls of the channel layers 208 to obtain the inner spacer features 240 in the inner spacer recesses 238. At block 116, the inner spacer material layer may also be removed from the top surfaces of the gate-top hard mask layer 226, the first gate spacer layer 232, the second gate spacer layer 234, and the isolation features 218. In some embodiments, the composition of the inner spacer material layer is selected such that the inner spacer material layer may be selectively removed without substantially etching the second gate spacer layer 234. In some implementations, the etch back operations performed at block 116 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 8, each of the inner spacer features 240 is in direct contact with the recessed sacrificial layers 206 and is disposed between two neighboring channel layers 208.

Figure 9:
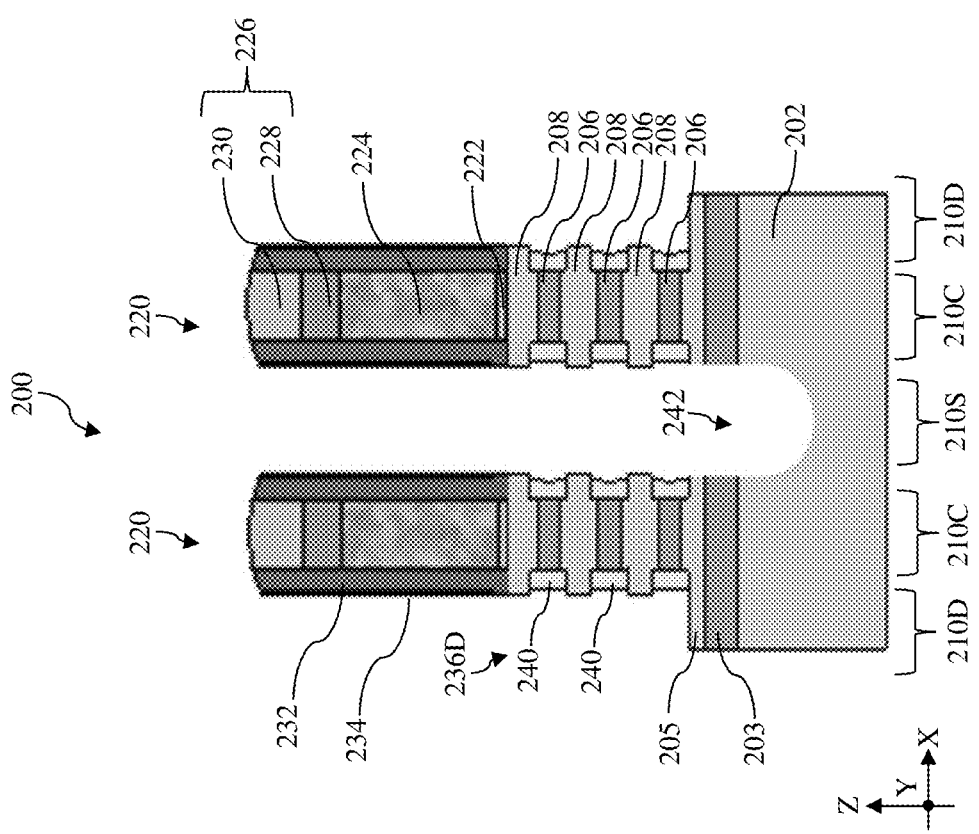

Referring to FIGS. 1 and 9, method 100 includes a block 118 where the source region 210S is selectively recessed to form a source access opening 242. At block 118, photolithography processes and etching processes are used to selectively extend the source recess 236S (shown in FIG. 8) through the bottom capping layer 205, the bottom sacrificial layer 203, and a portion of the substrate 202 while the drain recesses 236D are masked. In an example process for forming the source access opening 242, a hard mask and a photoresist layer are sequentially deposited. The photoresist layer is patterned using photolithographic techniques and the pattern in the photoresist layer is transferred to the hard mask layer by etching. The patterned hard mask layer covers the workpiece except for the source region 210S and is then applied as an etch mask to form the source access opening 242. The etch process at block 118 may be a dry etch process and may implement an oxygen-containing gas, a fluorine-containing gas (e.g., $CF_4$, $SF_6$, $CH_2F_2$, $CHF_3$, $C_4F_8$, $C_4F_6$, $CH_3F$, and/or $C_2F_6$), a carbon-containing gas (e.g., CO and/or $CH_4$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figures 10A, 10B:
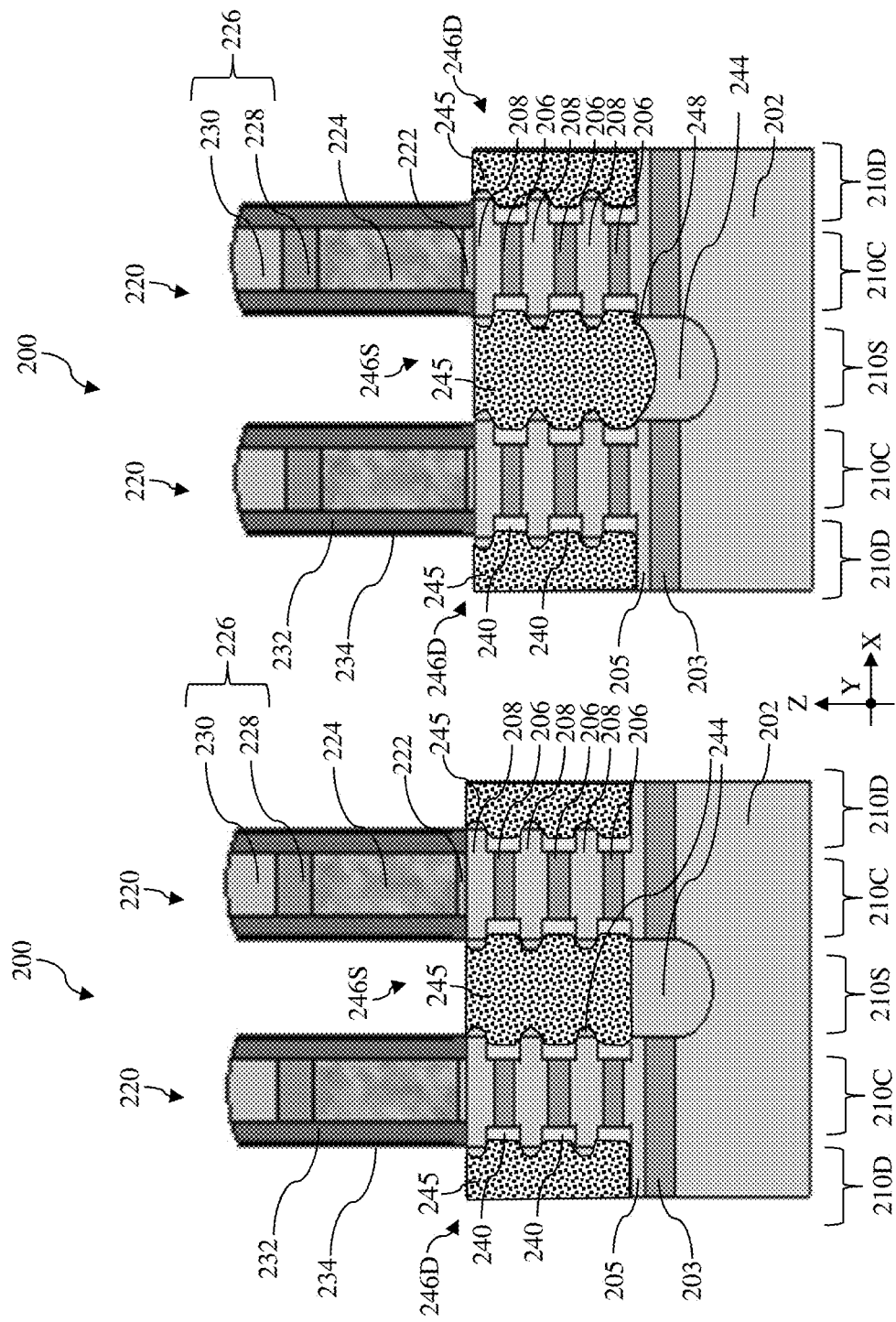

Referring to FIGS. 1, 10A and 10B, method 100 includes a block 120 where source features 246S and drain features 246D are formed. In some embodiments, each of the source features 246S and the drain features 246D includes a first epitaxial layer 244 and a second epitaxial layer 245. In some embodiments, the first epitaxial layer 244 may be epitaxially and selectively formed from the exposed top surfaces of the substrate 202, the bottom sacrificial layer 203, the bottom capping layer 205, and the channel layers 208. The first epitaxial layer 244 may be epitaxially deposited using an MBE process, a VPE process, an UHV-CVD process, an MOCVD process, and/or other suitable epitaxial growth processes. In these embodiments, the first epitaxial layer 244 is less likely to be attached and deposited on the inner spacer features 240. The first epitaxial layer 244 may be deposited into the source access opening 242. In instances shown in FIG. 10A, the first epitaxial layer 244 may have a substantially planar top surface. In other instances shown in FIG. 10B, the first epitaxial layer 244 may have a concave top surface. What is common in FIGS. 10A and 10B is that the first epitaxial layer 244 covers sidewalls of the bottom capping layer 205 and the bottom sacrificial layer 203 as the first epitaxial layer 244 epitaxially grows therefrom. In some implementations, the first epitaxial layer 244 may be formed of silicon (Si), germanium (Ge), or silicon germanium (SiGe). In some embodiments, the first epitaxially layer 244 is not intentionally doped or is dopant-free. When an n-type device is desired, the first epitaxial layer 244 may be formed of silicon. When a p-type device is desired, the first epitaxial layer 243 may be formed of germanium or silicon germanium.

After the deposition of the first epitaxial layer 244, a second epitaxial layer 245 is epitaxially deposited over the source regions 210S and the drain regions 210D. As shown in FIGS. 10A and 10B, in some embodiments, the second epitaxial layer 245 is epitaxially deposited using an MBE process, a VPE process, an UHV-CVD process, an MOCVD process, and/or other suitable epitaxial growth processes. During the epitaxial deposition, the second epitaxial layer 245 grows from the first epitaxial layer 244 and is allowed to over-grow and merge over the inner spacer features 240. The second epitaxial feature 245 may be in-situ doped during its epitaxial deposition. When an n-type device is desired, the second epitaxial layer 245 includes silicon that is in-situ doped with an n-type dopant, such as arsenic (As) or phosphorus (P). When a p-type device is desired, the second epitaxial layer 245 includes silicon germanium that is in-situ doped with a p-type dopant, such as boron (B). In some embodiments, the deposition of the first epitaxial layer 244 and the second epitaxial layer 245 may be performed in the same process chamber without breaking vacuum. To activate the dopants in the second epitaxial layer 245, block 120 may include an anneal process. In some implementation, the anneal process may include a rapid thermal anneal (RTA) process, a laser spike anneal process, a flash anneal process, or a furnace anneal process. In some instances, the anneal process includes a peak anneal temperature between about 900° C. and about 1100° C. As shown in FIGS. 10A and 10B, upon conclusion of the operations at block 120, source features 246S are formed over the source regions 210S and drain features 246D are formed over drain regions 210D. Each of the source features 246S and drain features 246D includes the second epitaxial layer 245 as an inner layer and the first epitaxial layer 244 as an outer layer. The outer layer is disposed between the inner layer and the channel layers 208, between the inner layer and the bottom capping layer 205, and between the inner layer and the substrate 202. Because the first epitaxial layer 244 is undoped, it may serve as a diffusion barrier that prevents too much dopants from diffusing into the channel layers 208, the bottom capping layer 205, and the substrate 202. The first epitaxial layer 244 helps maintain an abrupt dopant concentration profile at the interfaces between the channel layers 208 and the source features 246S and between the channel layers 208 and the drain features 246D, thereby reducing short channel effects.

Figures 11A, 11B:
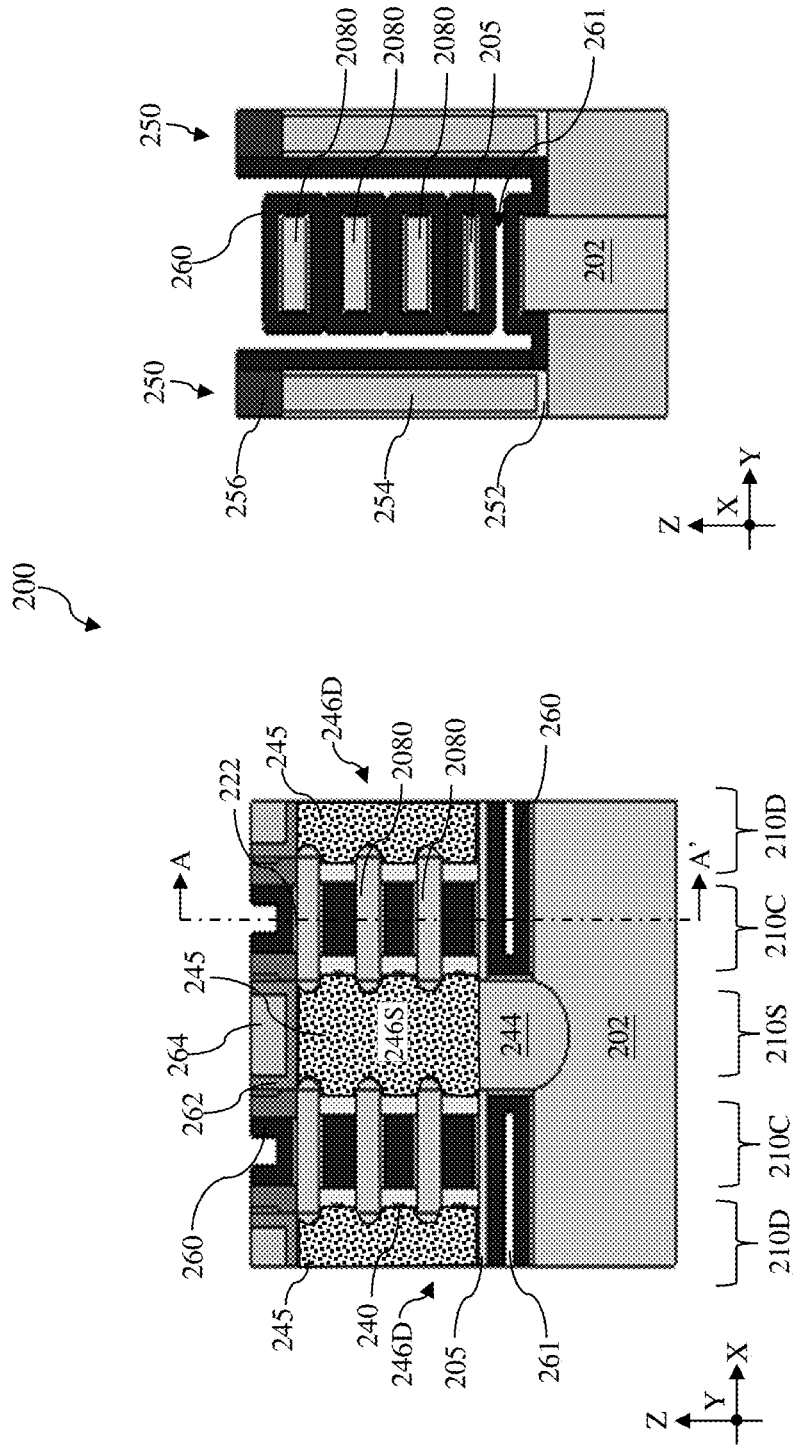

Referring to FIGS. 1, 11A and 11B, method 100 includes a block 122 where the dummy gate stack 220 is removed. Operations at block 122 may include formation of a contact etch stop layer (CESL) 262, deposition of an interlayer dielectric (ILD) layer 264 over the CESL 262, a planarization process to expose the dummy electrode layer 224, and removal of the dummy gate stack 220. In some examples, the CESL 262 may include silicon nitride, silicon oxynitride, and/or other materials known in the art. The CESL 262 may be formed by ALD, plasma-enhanced chemical vapor deposition (PECVD) process and/or other suitable deposition or oxidation processes. The ILD layer 264 is then deposited over the CESL 262. In some embodiments, the ILD layer 264 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 264 may be deposited by a PECVD process or other suitable deposition technique. In some embodiments, after formation of the ILD layer 264, the workpiece 200 may be annealed to improve integrity of the ILD layer 264. After the deposition of the CESL 262 and the ILD layer 264, the workpiece 200 may be planarized by a planarization process to expose the dummy electrode layer 224. For example, the planarization process may include a CMP process. Exposure of the dummy electrode layer 224 allows the removal of the dummy electrode layer 224 and removal of the dummy dielectric layer 222. In some embodiments, the removal of the dummy electrode layer 224 and the dummy dielectric layer 222 results in a gate trench over the channel regions 210C. The removal of the dummy electrode layer 224 and the dummy dielectric layer 222 may include one or more etching processes that are selective to the material in the dummy electrode layer 224 and the dummy dielectric layer 222. For example, the removal of the dummy electrode layer 224 and the dummy dielectric layer 222 may be performed using as a selective wet etch, a selective dry etch, or a combination thereof that is selective to the dummy electrode layer 224 and the dummy dielectric layer 222. After the selective removal of the dummy electrode layer 224 and the dummy dielectric layer 222, surfaces of the channel layers 208 and the sacrificial layers 206 in the channel regions 210C are exposed in the gate trench.

Referring to FIGS. 1, 11A and 11B, method 100 includes a block 124 where the sacrificial layers 206 and the bottom sacrificial layer 203 are selectively removed. To better illustrate the structural relationship, FIG. 11A provides a fragmentary cross-sectional view along a lengthwise direction of the dummy gate stacks 220 (shown in FIGS. 10A and 10B), which is along the Y direction and FIG. 11B provides a fragmentary cross-sectional view at line A-A' along the X direction, which is the lengthwise direction of the fin-shaped structure 210 (shown in FIG. 5). It is noted that hybrid fins 250 are shown in FIG. 11B. In the depicted embodiments, each of the hybrid fins 250 includes an outer dielectric layer 252, an inner dielectric layer 254, and a capping dielectric layer 256. The outer dielectric layer 252 and the capping dielectric layer 256 may include silicon nitride, metal oxide, silicon carbonitride, or silicon oxycarbide. The inner dielectric layer 254 may include silicon oxide or silicon oxycarbide, or other low-k dielectric materials. With sidewalls of the sacrificial layers 206 and the bottom sacrificial layer 203 exposed, they are selectively removed to release the channel layers 208 as channel members 2080 and to release the bottom capping layer 205. The selective removal of the sacrificial layers 206 and the bottom sacrificial layer 203 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx is removed by an etchant such as $NH_4OH$.

Referring to FIGS. 1, 11A, 11B, 12A, 12B, 13A, 13B, 14A, and 14B, method 100 includes a block 126 where a bottom dielectric layer 270 is formed between the bottom capping layer 205 and the substrate 202. To better illustrate the structural relationship, each of FIGS. 11A, 12A, 13A and 14A provides a fragmentary cross-sectional view along a lengthwise direction of the dummy gate stacks 220 (shown in FIGS. 10A and 10B), which is along the Y direction and each of FIGS. 11B, 12B, 13B, and 14B provides a fragmentary cross-sectional view at line A-A' along the X direction, which is the lengthwise direction of the fin-shaped structure 210 (shown in FIG. 5). It is noted that hybrid fins 250 are shown in FIGS. 11B, 12B, 13B and 14B. In the depicted embodiments, each of the hybrid fins 250 includes an outer dielectric layer 252, an inner dielectric layer 254, and a capping dielectric layer 256. The outer dielectric layer 252 and the capping dielectric layer 256 may include silicon nitride, metal oxide, silicon carbonitride, or silicon oxycarbide. The inner dielectric layer 254 may include silicon oxide or silicon oxycarbide, or other low-k dielectric materials.

Referring first to FIGS. 11A and 11B, a first dielectric filler layer 260 is deposited over the workpiece 200, including into the gate trench. The first dielectric filler layer 260 may be deposited using ALD, PEALD, CVD, or PECVD such that it wraps around each of the channel members 2080 and the bottom capping layer 205. As shown in FIGS. 11A and 11B, the first dielectric filler layer 260 fills the space between two neighboring channel members 2080 and the space between the bottom capping layer 205 and the substrate 202. In some embodiments shown in FIGS. 11A and 11B, because the space between the bottom capping layer 205 and the substrate 202 is deeper in the gate trench and is greater than the space between channel members 2080, a seam 261 may be formed. In some embodiments, the first dielectric filler layer 260 may be formed of a dielectric material selected from silicon nitride, titanium oxide, aluminum oxide, hafnium oxide, zirconium oxide, or other suitable dielectric material.

Figures 12A, 12B:
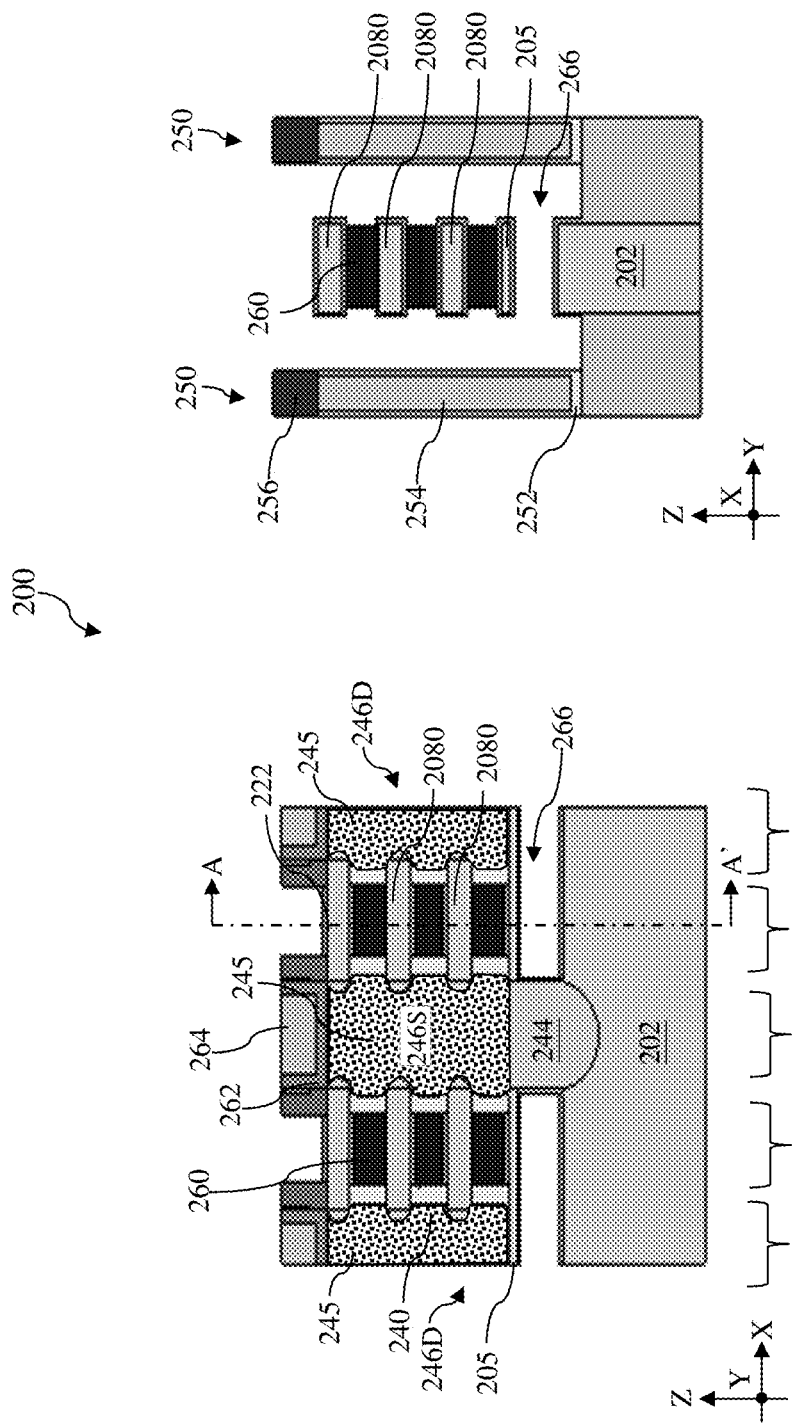

Referring then to FIGS. 12A and 12B, the first dielectric filler layer 260 is recessed. The recessing of the first dielectric filler layer 260 includes an isotropic wet etch process or an isotropic dry etch process that is selective to the first dielectric filler layer. For example, the isotropic dry etch process or wet etch process may include use of a solution of ammonium hydroxide and hydrogen peroxide, such as RCA Standard Clean-1 (SC-1), or other cleaning solutions. As shown in FIGS. 12A and 12B, because the seam 261 provides more access to the first dielectric filler layer 260 in the space between the bottom capping layer 205 and the substrate 202, the first dielectric filler layer 260 in the space between the bottom capping layer 205 and the substrate 202 etches faster than the first dielectric filler layer 260 between neighboring channel members 2080. The recessing here is time-controlled to completely remove the first dielectric filler layer 260 in the space between the bottom capping layer 205 and the substrate 202 while the first dielectric filler layer 260 remains disposed between neighboring channel members 2080. It is noted that the first dielectric filler layer 260 is also removed from a top surface of the topmost channel member 2080. The complete removal of the first dielectric filler layer 260 in the space between the bottom capping layer 205 and the substrate 202 leaves behind bottom vacancies 266 between the bottom capping layer 205 and the substrate 202. The bottom vacancies 266 may be divided by the first epitaxial layer 244 deposited in the source access opening 242 (shown in FIG. 9).

Figures 13A, 13B:
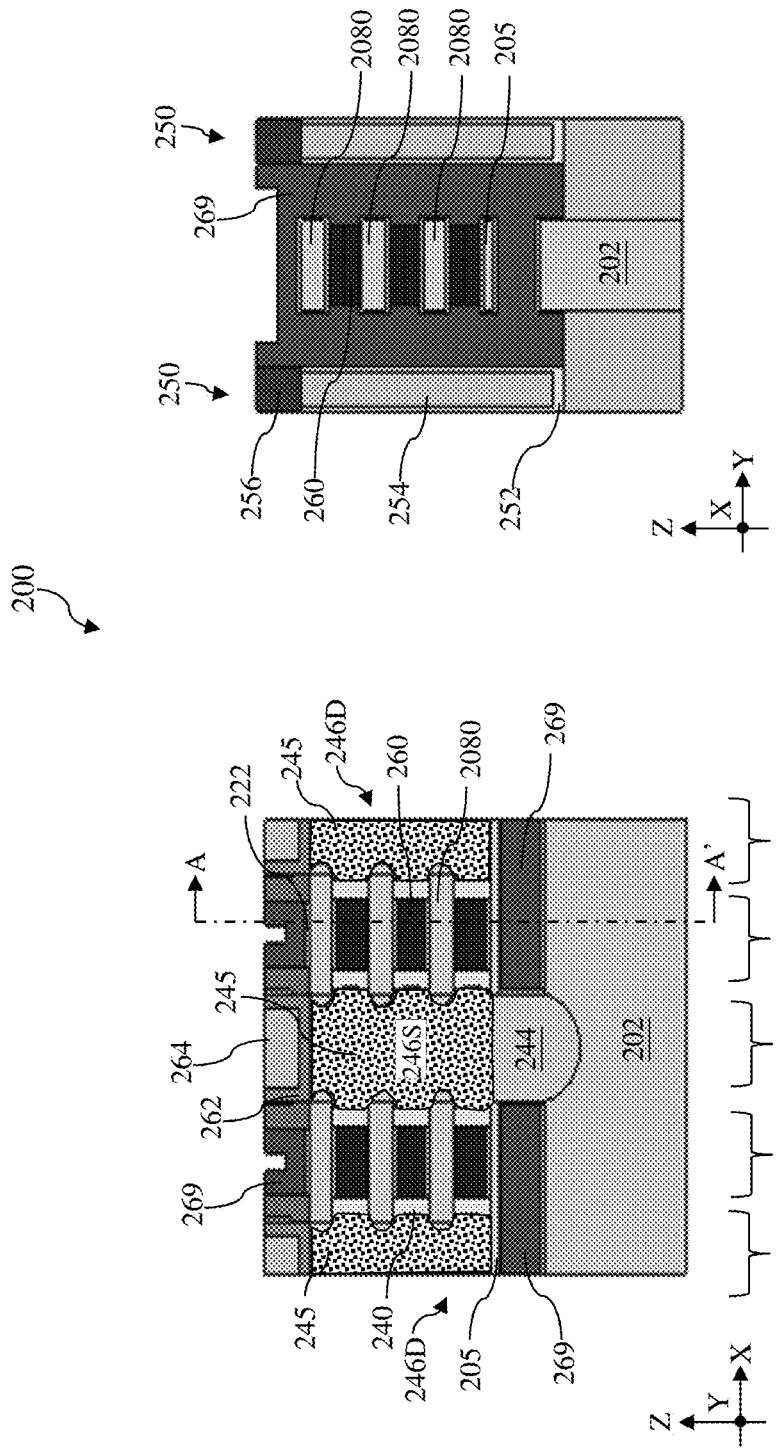

Referring to FIGS. 13A and 13B, a second dielectric filler layer 269 is deposited over the workpiece 200. The second dielectric filler layer 269 may be deposited using ALD, PEALD, CVD, or PECVD such that it wraps around the channel members 2080, the first dielectric filler layer 260, and the bottom capping layer 205. As shown in FIG. 13B, the second dielectric filler layer 269 is deposited over the topmost channel member 2080, into the space between the hybrid fins 250 and the channel members 2080, and into the space between the bottom capping layer 205 and the substrate 202. The first dielectric filler layer 260 between the channel members 2080 functions to prevent the second dielectric filler layer 269 (or too much thereof) to enter between the channel members 2080. The second dielectric filler layer 269 may be formed of a dielectric material selected from silicon nitride, titanium oxide, aluminum oxide, hafnium oxide, zirconium oxide, or other suitable dielectric material. A composition of the second dielectric filler layer 269 is different from a composition of the first dielectric filler layer 260. In some embodiments, the compositions of the first dielectric filler layer 260 and the second dielectric filler layer 269 are selected such that the first dielectric filler layer 260 may be selectively etched or etched faster than the second dielectric filler layer 269. This material selection ensures complete removal of the first dielectric filler layer 260 while the second dielectric filler layer 269 remains in the space between the bottom capping layer 205 and the substrate 202. In some implementations, an etch selectivity for the first dielectric filler layer 260 over the channel members 2080 (formed of silicon in some embodiments) or silicon nitride is greater than 50 and an etch selectivity for the first dielectric filler layer 260 over the second dielectric filler layer 269 is greater than 25.

Figures 14A, 14B:
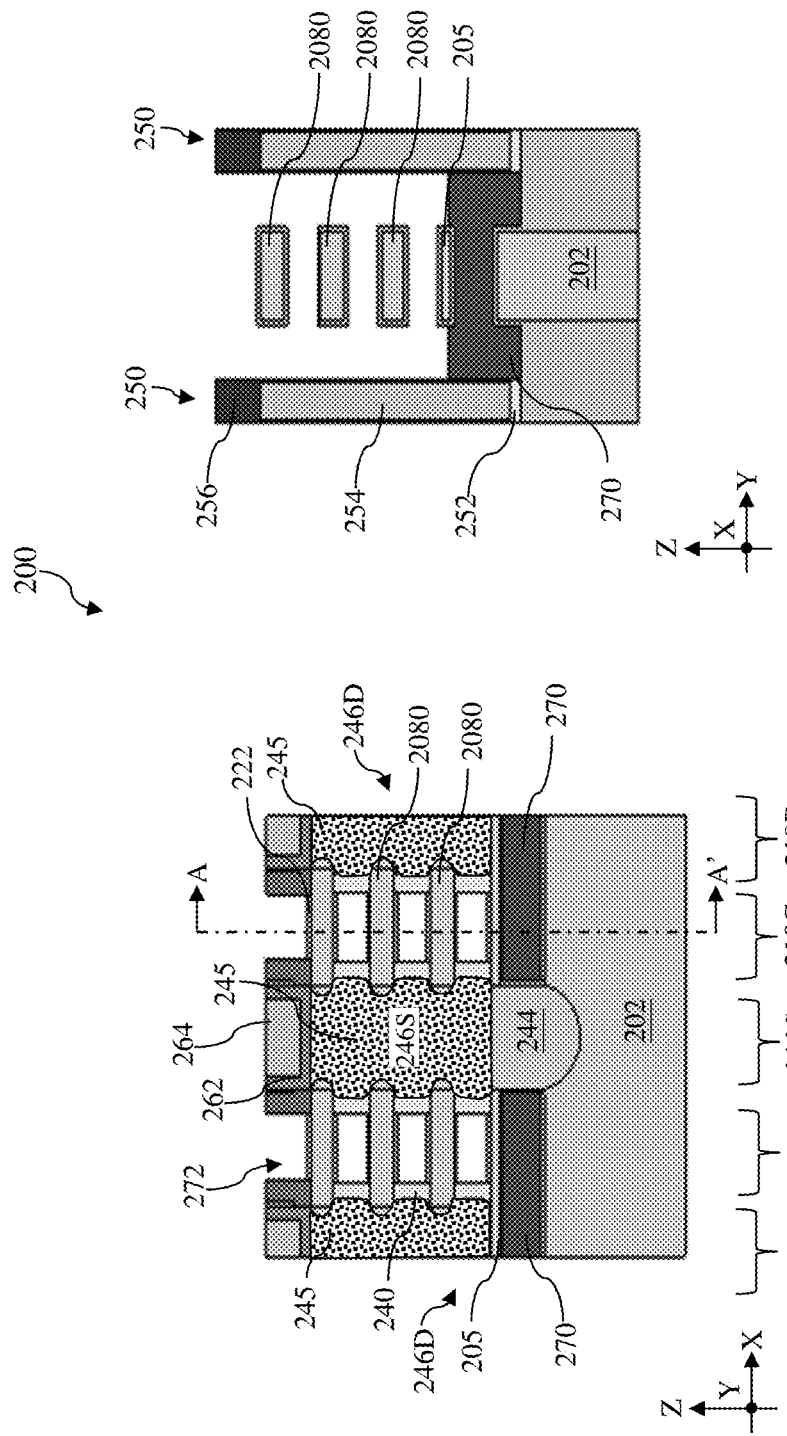

Referring to FIGS. 14A and 14B, the second dielectric filler layer 269 and the first dielectric filler layer 260 are etched back in a top-down manner. The etch back of the first dielectric filler layer 260 and the second dielectric filler layer 269 includes an isotropic wet etch process or an isotropic dry etch process that is selective to the first dielectric filler layer. For example, the isotropic dry etch process or wet etch process may include use of diluted hydrofluoric acid (DHF), buffered hydrofluoric acid (BHF), or a solution of ammonium hydroxide and hydrogen peroxide (such as RCA Standard Clean-1 (SC-1)). As described above, in some embodiments, an etch selectivity for the first dielectric filler layer 260 over the channel members 2080 (formed of silicon in some embodiments) or silicon nitride is greater than 50 and an etch selectivity for the first dielectric filler layer 260 over the second dielectric filler layer 269 is greater than 25. This arrangement allows the isotropic etch process to etch the first dielectric filler layer 260 and the second dielectric filler layer 269 without damaging the channel members 2080. In addition, because the first dielectric filler layer 260 etches faster than the second dielectric filler layer 269, the first dielectric filler layer 260 between channel members 2080 may be completely removed while the second dielectric filler layer 269 remains disposed between the bottom capping layer 205 and the substrate 202. The second dielectric filler layer 269 that remains between the bottom capping layer 205 and the substrate 202 may be referred to as a bottom dielectric layer 270. As will be described below, because the bottom dielectric layer 270 enables self-alignment of backside source contact openings and backside source contacts, it may also be referred to as a bottom self-aligned contact (SAC) dielectric layer 270. It is noted that, after the formation of the bottom dielectric layer 270, the channel members 2080 remain suspended (i.e., released) and are ready for gate structure formation.

Figure 15A:
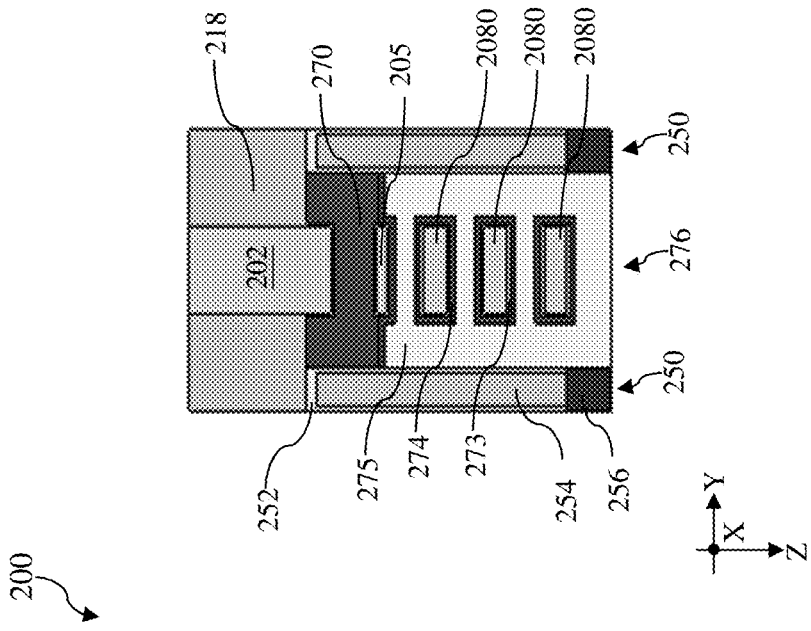
Figure 15B:
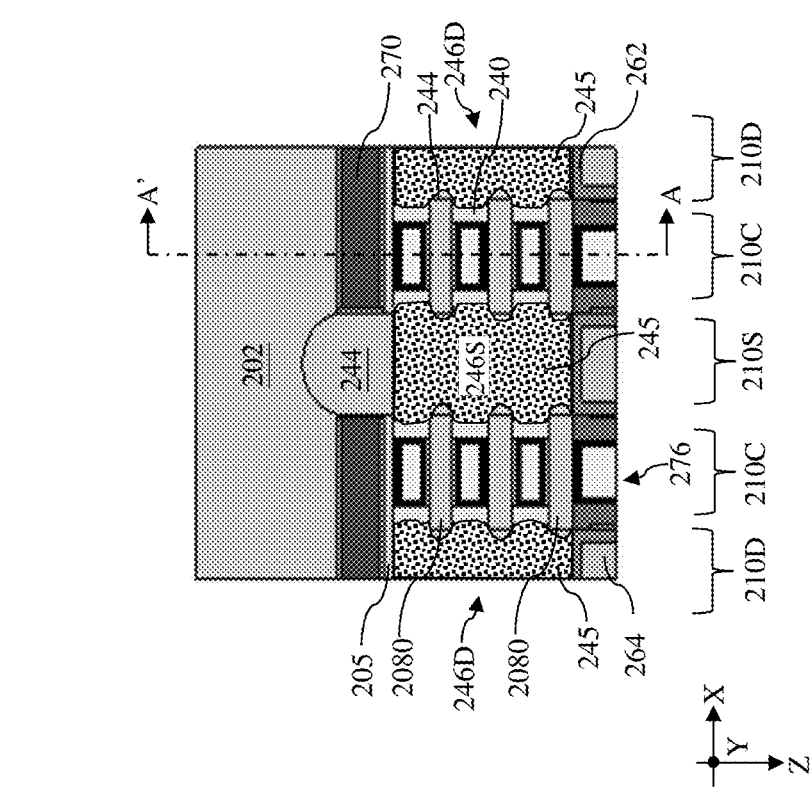

Referring to FIGS. 1, 15A and 15B, method 100 includes a block 128 where a gate structure 276 is formed. The gate structure 276 wraps around each of the channel members 2080, which are formed from the channel layers 208. The gate structure 276 may be a high-K metal gate structure. Here, "high-k" indicates that a gate dielectric layer in the gate structure 276 has a dielectric constant greater than that of silicon dioxide, which is about 3.9. In various embodiments, the gate structure 276 includes an interfacial layer 273, a gate dielectric layer 274 formed over the interfacial layer 273, and/or a gate electrode layer 275 formed over the gate dielectric layer 274. In some embodiments, the interfacial layer 273 may include a dielectric material such as silicon oxide, hafnium silicate, or silicon oxynitride. The interfacial layer 273 may be formed after the selective removal of the sacrificial layers 206 and the bottom sacrificial layer 203 at block 124. In an example process, the interfacial layer 273 may be native oxide formed as a result of a cleaning process that uses RCA SC-1 (ammonia, hydrogen peroxide and water) and/or RCA SC-2 (hydrochloric acid, hydrogen peroxide and water). In alternative embodiments, the interfacial layer 273 may be formed anew at block 128. The gate dielectric layer 274 may include a high-K dielectric material such as hafnium oxide. Alternatively, the gate dielectric layer 274 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. The gate dielectric layer 274 may be formed by ALD, physical vapor deposition (PVD), CVD, oxidation, and/or other suitable methods.

The gate electrode layer 275 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 275 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 275 may be formed by ALD, PVD, CVD, e-beam evaporation, or other suitable process. In various embodiments, after the deposition of the gate electrode layer 275, a CMP process may be performed to remove excessive metal from the workpiece 200, thereby providing substantially planar top surfaces of the gate structure 276.

Referring to FIGS. 1, 15A, 15B, 16A and 16B, method 100 includes a block 130 where a backside source contact opening 278 is formed to expose the source feature 246S. Operations at block 130 may be performed after the workpiece 200 is flipped upside down, as shown in FIGS. 15A and 15B where the Z coordinate is also flipped upside down. In some embodiments, the workpiece 200 is bonded to a carrier substrate (not explicitly shown) and flipped over before the formation of middle-end-of-line (MEOL) structures, such as front-side source/drain contacts and gate contacts. In some other embodiments, the workpiece 200 is bonded to a carrier substrate (not explicitly shown) and flipped over after the formation of MEOL structures and a portion of back-end-of-line (BEOL) structures, such as an interconnect structure. In still other embodiments, the workpiece 200 is bonded to a carrier substrate (not explicitly shown) and flipped over after formation of all MEOL and BEOL structures. Although not explicitly shown, the substrate 202 may be subject to a grinding process or a planarization process. As a result of the grinding process or the planarization process, top surfaces of the substrate 202 and the top surfaces of the isolation feature 218 are coplanar, as shown in FIGS. 15A and 15B. In FIGS. 15A and 15B, the remaining substrate 202 is the portion of the substrate 202 that is formed into a base portion of the fin-shaped structure 210.

Reference is now made to FIGS. 16A and 16B. At block 130, the remaining substrate 202 and the first epitaxial layer 244 are selectively etched to form a backside source contact opening 278 and a backside power rail trench 280. With reference to FIGS. 15A, 15B, 16A, and 16B, the backside source contact opening 278 corresponds to the first epitaxial layer 244 that has been deposited in the source access opening 242 (shown in FIG. 9). In other words, the backside source contact opening 278 corresponds to the source access opening 242. The backside source contact opening 278 and the backside power rail trench 280 are formed in a self-aligned manner due to the compositional difference between the first epitaxial layer 244 and the bottom dielectric layer 270 as well as the compositional difference between the substrate 202 and the isolation feature 218. In embodiments where the first epitaxial layer 244 includes silicon, germanium or silicon germanium and the substrate 202 includes silicon, the selective etching at block 130 may be performed using a selective dry etch process. An example selective dry etch process may include use of hydrogen ($H_2$), a fluorine-containing gas (e.g., $CF_4$, $SF_6$, $CH_2F_2$, $CHF_3$, $C_4F_8$, $C_4F_6$, $CH_3F$, $NF_3$, and/or $C_2F_6$), and/or combinations thereof. Upon conclusion of the operations at block 130, the source feature 246S is exposed in the backside source contact opening 278. Unlike the source feature 246S, the drain features 246D in the drain regions 210D and the gate structures 276 in the channel region 210C are covered and protected by the bottom capping layer 205 and the bottom dielectric layer 270 (i.e., bottom SAC dielectric layer 270).

Referring to FIGS. 1, 17A and 17B, method 100 includes a block 132 where a backside source contact 284 and a backside power rail 286 are formed. In some embodiments, to reduce contact resistance, a silicide layer 282 may be formed on the exposed source feature 246S by depositing a metal layer over the source feature 246S and performing an anneal process to bring about silicidation between the metal layer and the source feature 246S. Suitable metal layer may include titanium (Ti), tantalum (Ta), nickel (Ni), cobalt (Co), or tungsten (W). The silicide layer 282 may include titanium silicide (TiSi), titanium silicon nitride (TiSiN), tantalum silicide (TaSi), tungsten silicide (WSi), cobalt silicide (CoSi), or nickel silicide (NiSi). In some embodiments, a liner 281 may be formed by putting the deposited metal layer with ammonia ($NH_3$) and as a result, the liner 281 may include titanium nitride (TiN), tantalum nitride (TaN), nickel nitride (NiN), cobalt nitride (CoN), or tungsten nitride (WN). After the formation of the silicide layer 282, a metal fill layer may be deposited into the backside source contact opening 278 and the backside power rail trench 280 to form the backside source contact 284 and the backside power rail 286, respectively. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to provide a planar top surface, setting the stage for subsequent processes.

Reference is made to FIG. 17A. Upon conclusion of the operations at block 132, an MBC transistor 290 is substantially formed. The MBC transistor 290 may be an n-type MBC transistor or a p-type MBC transistor. The MBC transistor 290 includes a source feature 246S, a drain feature 246D, a plurality of channel members 2080 extending between the source feature 246S and the drain feature 246D, and a gate structure 276 wrapping around each of the plurality of channel members 2080. The plurality of channel members 2080 are vertically stacked along the Z direction and each extend lengthwise along the X direction. The channel members 2080 may also be referred to as nanostructures 2080 due to their nanoscale dimensions. Each of the source feature 246S and the drain feature 246D includes the first epitaxial layer 244 as an outer layer to interface the channel members 2080 and a second epitaxial layer 245 spaced apart from the channel members 2080 by the first epitaxial layer 244. The first epitaxial layer 244 is not intentionally doped while the second epitaxial layer 245 is in-situ doped. As shown in FIG. 17A, the drain feature 246D and the gate structure 276 are spaced part and electrically isolated from the backside power rail 286 by the bottom capping layer 205 and the bottom dielectric layer 270. The source feature 246S is electrically coupled to the backside power rail 286 by way of the backside source contact 284. In the depicted embodiment, the backside power rail 286 and the backside source contact 284 are continuously formed. The silicide layer 282 is disposed at the interface between the backside source contact 284 and the source feature 246S to reduce contact resistance. In other words, the silicide layer 282 is sandwiched between the backside source contact 284 and the source feature 246S. The backside power rail 286 is configured to carry positive supply voltage and hence its name.

Although not intended to be limiting, one or more embodiments of the present disclosure provide benefits to a semiconductor device and the formation thereof. For example, embodiments of the present disclosure include a bottom SAC dielectric layer that covers the gate structure and a backside source contact extends through the bottom SAC dielectric layer to couple the source feature. In the example processes, the bottom SAC dielectric layer includes an opening over the source feature and enables formation of a backside source contact opening in a self-aligned manner. This self-alignment prevents short circuits without requiring precise overlay. As a result, methods of the present disclosure include a greater process window and an improved yield.

In one exemplary aspect, the present disclosure is directed to a semiconductor device. The semiconductor device includes a source feature and a drain feature, a plurality of semiconductor nanostructures extending between the source feature and the drain feature, a gate structure wrapping around each of the plurality of semiconductor nanostructures, a bottom dielectric layer over the gate structure and the drain feature, a backside power rail disposed over the bottom dielectric layer, and a backside source contact disposed between the source feature and the backside power rail. The backside source contact extends through the bottom dielectric layer.

In some embodiments, the bottom dielectric layer includes silicon nitride, titanium oxide, aluminum oxide, hafnium oxide, or zirconium oxide. In some implementations, the semiconductor device may further include a silicide layer sandwiched between the backside source contact and the source feature. The silicide layer includes tungsten silicide, cobalt silicide, nickel silicide, or titanium silicide. In some implementations, the semiconductor device may further include a bottom capping layer between the bottom dielectric layer and the drain feature. In some instances, the bottom capping layer extends between the bottom dielectric layer and the gate structure. In some embodiments, the backside source contact extends through the bottom capping layer. In some implementations, the bottom capping layer includes silicon. In some embodiments, the semiconductor device may further include an epitaxial feature between each of the plurality of the semiconductor nanostructures and the source feature. A composition of the epitaxial feature is different from a composition of the source feature.

In another exemplary aspect, the present disclosure is directed to a semiconductor device. The semiconductor device includes a source feature and a drain feature, a plurality of semiconductor nanostructures extending between the source feature and the drain feature, a gate structure wrapping around each of the plurality of semiconductor nanostructures, a bottom dielectric layer over the gate structure and the drain feature, and a backside power rail disposed over the bottom dielectric layer. The backside power rail is isolated from the drain feature by the bottom dielectric layer and the backside power rail is electrically coupled to the source feature.

In some embodiments, the backside power rail is electrically coupled to the source feature by way of a backside source contact that extends through the bottom dielectric layer. In some implementations, the bottom dielectric layer includes silicon nitride, titanium oxide, aluminum oxide, hafnium oxide, or zirconium oxide. In some implementations, the semiconductor device may further include a bottom capping layer between the bottom dielectric layer and the drain feature. In some embodiments, the bottom capping layer extends between the bottom dielectric layer and the gate structure. In some instances, the backside power rail is electrically coupled to the source feature by way of a backside source contact that extends through the bottom dielectric layer and the bottom capping layer. In some embodiments, the bottom capping layer includes silicon.

In yet another exemplary aspect, the present disclosure is directed to a method. The method includes receiving a workpiece that includes a substrate, a bottom sacrificial layer disposed over the substrate, a bottom capping layer disposed over the bottom sacrificial layer, and a stack over the bottom capping layer and including a plurality of channel layers interleaved by a plurality of sacrificial layers, forming a fin-shaped structure from the substrate, the bottom sacrificial layer, a bottom capping layer, and the stack, forming a dummy gate stack over a channel region of the fin-shaped structure, forming a source recess over a source region of the fin-shaped structure and a drain recess over a drain region of the fin-shaped structure, selectively etching the source region to extend the source recess through the bottom capping layer and the bottom sacrificial layer to expose the substrate, thereby forming a source access opening, depositing a first epitaxial layer in the source access opening, after the depositing of the first epitaxial layer, forming a second epitaxial layer to form a source feature in the source recess and a drain feature in the drain recess, removing the dummy gate stack, selectively removing the plurality of sacrificial layers in the channel region and the bottom sacrificial layer to release the plurality of channel layers as a plurality of channel members, forming a bottom dielectric layer between the substrate and the bottom capping layer, forming a gate structure around each of the plurality of channel members, selectively etching the first epitaxial layer in the source access opening to expose the source feature in a backside source contact opening, and forming a backside source contact in the backside source contact opening.

In some embodiments, the plurality of channel layers includes silicon. The plurality of sacrificial layers and the bottom sacrificial layer include silicon germanium, and a germanium content of the plurality of sacrificial layers is greater than a germanium content of the bottom sacrificial layer. In some embodiments, the forming of the bottom dielectric layer includes depositing a first dielectric filler layer on surfaces of the plurality of channel members, the substrate, and the bottom capping layer, isotropically etching the first dielectric filler layer to remove the first dielectric filler layer between the bottom capping layer and the substrate while the first dielectric filler layer is disposed between the plurality of channel members, after the isotropically etching, depositing a second dielectric filler layer between the bottom capping layer and the substrate, and recessing the first dielectric filler layer and the second dielectric filler layer until the plurality of channel members are released again and a portion of the second dielectric filler layer remains between the bottom capping layer and the substrate. In some implementations, the bottom dielectric layer includes silicon nitride, titanium oxide, aluminum oxide, hafnium oxide, or zirconium oxide. In some instances, the second epitaxial layer includes a dopant selected from a group consisting of phosphorus, arsenic, and boron. The first epitaxial layer is free of the dopant.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a source feature and a drain feature;
a plurality of semiconductor nanostructures extending between the source feature and the drain feature along a horizontal direction and stacked one over another along a vertical direction;
a gate structure wrapping around each of the plurality of semiconductor nanostructures;
a bottom dielectric layer disposed directly over the gate structure and the drain feature;
a backside power rail disposed on the bottom dielectric layer and spanning directly over the source feature, the gate structure and the drain feature;
a backside source contact disposed directly between the source feature and the backside power rail along the vertical direction; and
a semiconductor bottom capping layer sandwiched between the bottom dielectric layer and the drain feature along the vertical direction,
wherein top surfaces of the drain feature and the gate structure are coplanar,
wherein the backside source contact extends completely through the bottom dielectric layer and partially into the source feature along the vertical direction such that a bottom surface of the backside source contact is lower than a bottom surface of the bottom dielectric layer,
wherein the backside power rail and the backside source contact are a continuous structure.

2. The semiconductor device of claim 1, wherein the bottom dielectric layer comprises silicon nitride, titanium oxide, aluminum oxide, hafnium oxide, or zirconium oxide.

3. The semiconductor device of claim 1,
wherein the backside source contact comprises a silicide layer at an interface between the backside source contact and the source feature,
wherein the silicide layer comprises tungsten silicide, cobalt silicide, nickel silicide, or titanium silicide.

4. The semiconductor device of claim 1,
wherein the semiconductor bottom capping layer is in direct contact with the bottom dielectric layer and the drain feature,
wherein the backside power rail is in direct contact with a top surface of the bottom dielectric layer.

5. The semiconductor device of claim 1, wherein the semiconductor bottom capping layer extends between the bottom dielectric layer and the gate structure.

6. The semiconductor device of claim 5, wherein the backside source contact extends through the semiconductor bottom capping layer.

7. The semiconductor device of claim 5, wherein the semiconductor bottom capping layer comprises silicon.

8. The semiconductor device of claim 1, further comprising:
an epitaxial feature between each of the plurality of the semiconductor nanostructures and the source feature,
wherein a composition of the epitaxial feature is different from a composition of the source feature.

9. A semiconductor device, comprising:
a source feature and a drain feature;
a plurality of semiconductor nanostructures extending between the source feature and the drain feature along a first direction;
a first dielectric fin and a second dielectric fin sandwiching the source feature and the drain feature along a second direction perpendicular to the first direction;
a first isolation feature disposed on the first dielectric fin;
a second isolation feature disposed on the second dielectric fin;
a gate structure wrapping around each of the plurality of semiconductor nanostructures;
a bottom dielectric layer disposed over the gate structure and the drain feature and sandwiched directly between the first dielectric fin and the second dielectric fin along the second direction; and
a backside power rail disposed over the bottom dielectric layer,
wherein the backside power rail is isolated from the drain feature by the bottom dielectric layer,
wherein the backside power rail is electrically coupled to the source feature,
wherein each of the first dielectric fin and the second dielectric fin comprises an inner dielectric layer, an outer dielectric layer wrapping over the inner dielectric layer, and a dielectric capping layer underlying and in direct contact with the inner dielectric layer and the outer dielectric layer.

10. The semiconductor device of claim 9, wherein the backside power rail is electrically coupled to the source feature by way of a backside source contact that extends through the bottom dielectric layer.

11. The semiconductor device of claim 9, wherein the bottom dielectric layer comprises silicon nitride, titanium oxide, aluminum oxide, hafnium oxide, or zirconium oxide.

12. The semiconductor device of claim 9, further comprising:
a bottom capping layer sandwiched between and in direct contact with the bottom dielectric layer and the drain feature.

13. The semiconductor device of claim 12,
wherein the bottom capping layer is sandwiched directly between the bottom dielectric layer and the gate structure,
wherein the bottom dielectric layer is sandwiched directly between the bottom capping layer and the backside power rail.

14. The semiconductor device of claim 12, wherein the backside power rail is electrically coupled to the source feature by way of a backside source contact that extends through the bottom dielectric layer and the bottom capping layer.

15. The semiconductor device of claim 12, wherein the bottom capping layer comprises silicon.

16. The semiconductor device of claim 9, wherein the source feature is disposed on a contact etch stop layer (CESL) and an interlayer dielectric (ILD) layer spaced apart from the source feature by the CESL.

17. A semiconductor structure, comprising:
a first vertical stack of channel members disposed directly over a first semiconductor capping layer and a first bottom dielectric layer;
a first gate structure wrapping around each of the first vertical stack of channel members and disposed directly over a top surface of the first semiconductor capping layer;
a second vertical stack of channel members disposed directly over a second semiconductor capping layer and a second bottom dielectric layer;
a second gate structure wrapping around each of the second vertical stack of channel members and disposed directly over a top surface of the first semiconductor capping layer;
an epitaxial feature extending between the first vertical stack of channel members and the second vertical stack of channel members; and
a backside contact extending between the first semiconductor capping layer and the second semiconductor capping layer as well as between the first bottom dielectric layer and the second bottom dielectric layer to electrically couple to a bottom surface of the epitaxial feature,
wherein the first semiconductor capping layer and the second semiconductor capping layer are formed of a semiconductor material deposited using an epitaxial deposition process,
wherein a bottom surface of the first gate structure is in direct contact with a top surface of the first semiconductor capping layer,
wherein a bottom surface of the second gate structure is in direct contact with a top surface of the second semiconductor capping layer,
wherein the first semiconductor capping layer and the second semiconductor capping layer are formed of silicon.

18. The semiconductor structure of claim 17, wherein the first bottom dielectric layer and the second bottom dielectric layer comprise silicon nitride, titanium oxide, aluminum oxide, hafnium oxide, or zirconium oxide.

19. The semiconductor structure of claim 17, further comprising:
a silicide layer sandwiched between the backside contact and the bottom surface of the epitaxial feature,
wherein the silicide layer comprises titanium silicide (TiSi), titanium silicon nitride (TiSiN), tantalum silicide (TaSi), tungsten silicide (WSi), cobalt silicide (CoSi), or nickel silicide (NiSi).

20. The semiconductor structure of claim 17, wherein the backside contact is in contact with sidewalls of the first semiconductor capping layer, the second semiconductor capping layer, the first bottom dielectric layer, and the second bottom dielectric layer.

* * * * *